(12) United States Patent
Sugizaki et al.

(10) Patent No.: US 9,054,332 B2
(45) Date of Patent: Jun. 9, 2015

(54) ORGANIC ELECTROLUMINESCENT DEVICE AND LIGHT EMITTING APPARATUS

(71) Applicant: Kabushiki Kaisha Toshiba, Minato-ku (JP)

(72) Inventors: Tomoko Sugizaki, Kanagawa-ken (JP); Tomio Ono, Kanagawa-ken (JP); Shintaro Enomoto, Kanagawa-ken (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 13/952,961

(22) Filed: Jul. 29, 2013

(65) Prior Publication Data
US 2014/0110684 A1    Apr. 24, 2014

(30) Foreign Application Priority Data
Oct. 22, 2012   (JP) .................................. 2012-232935

(51) Int. Cl.
*H01L 29/08*   (2006.01)
*H01L 51/52*   (2006.01)

(52) U.S. Cl.
CPC ............. *H01L 51/52* (2013.01); *H01L 51/5206* (2013.01); *H01L 51/5271* (2013.01)

(58) Field of Classification Search
CPC .. H01L 51/52; H01L 51/5271; H01L 51/5206
USPC .................................................. 257/40
See application file for complete search history.

(56) References Cited

U.S. PATENT DOCUMENTS

| | | | |
|---|---|---|---|
| 8,026,662 B2* | 9/2011 | Ishihara et al. ............... | 313/504 |
| 2008/0218063 A1* | 9/2008 | Greiner ......................... | 313/504 |
| 2008/0312437 A1* | 12/2008 | Inoue et al. .................... | 544/225 |
| 2010/0194267 A1* | 8/2010 | Forrest et al. ................. | 313/504 |
| 2010/0224313 A1* | 9/2010 | Chari et al. ................... | 156/242 |
| 2010/0277460 A1* | 11/2010 | Sato .............................. | 345/211 |
| 2011/0169400 A1* | 7/2011 | Seo et al. ...................... | 313/504 |

FOREIGN PATENT DOCUMENTS

| | | |
|---|---|---|
| JP | 2008-243557 | 10/2008 |
| JP | 2010-40512 | 2/2010 |

* cited by examiner

*Primary Examiner* — Armando Rodriguez
*Assistant Examiner* — Mohammed R Alam
(74) *Attorney, Agent, or Firm* — Oblon, McClelland, Maier & Neustadt, L.L.P.

(57) ABSTRACT

According to one embodiment, an organic electroluminescent device includes a support substrate, a first electrode, a second electrode, and an intermediate layer. The first electrode is opposed to the support substrate. The second electrode is provided between the support substrate and the first electrode and includes a conductive polymer material. The intermediate layer is provided between the first electrode and the second electrode. A thickness dimension of the intermediate layer is 140 nanometers or less.

19 Claims, 6 Drawing Sheets

US 9,054,332 B2

ORGANIC ELECTROLUMINESCENT DEVICE AND LIGHT EMITTING APPARATUS

CROSS-REFERENCE TO RELATED APPLICATIONS

This application is based upon and claims the benefit of priority from Japanese Patent Application No. 2012-232935, filed on Oct. 22, 2012; the entire contents of which are incorporated herein by reference.

FIELD

Embodiments described herein relate generally to an organic electroluminescent device and a light emitting apparatus.

BACKGROUND

These days, organic electroluminescent devices are studied for practical use in display devices, light sources, illumination, etc. The organic electroluminescent device includes a cathode, an anode, and an organic layer provided between the cathode and the anode. When a current flows between the cathode and the anode, an exciton is generated in the organic layer, and light emission occurs when the exciton undergoes radiative deactivation.

DETAILED DESCRIPTION

Figure 1:
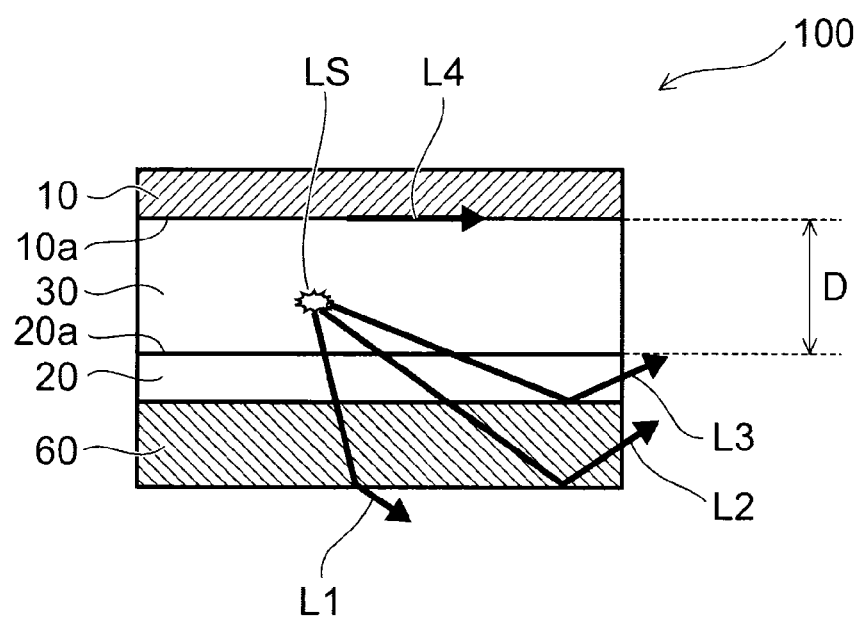
FIG. 1 is a cross-sectional view showing an organic electroluminescent device according to a first embodiment.

According to one embodiment, an organic electroluminescent device includes a support substrate, a first electrode, a second electrode, and an intermediate layer. The first electrode is opposed to the support substrate. The second electrode is provided between the support substrate and the first electrode and includes a conductive polymer material. The intermediate layer is provided between the first electrode and the second electrode. A thickness dimension of the intermediate layer is 140 nanometers or less.

According to another embodiment, a light emitting apparatus includes a light emitting unit, a drive unit, and a control unit. The light emitting unit includes an organic electroluminescent device. The drive unit is configured to supply a current to the organic electroluminescent device. The control unit is configured to control the drive unit. The organic electroluminescent device includes a support substrate, a first electrode, a second electrode, and an intermediate layer. The first electrode is opposed to the support substrate. The second electrode is provided between the support substrate and the first electrode and includes a conductive polymer material. The intermediate layer is provided between the first electrode and the second electrode. A thickness dimension of the intermediate layer is 140 nanometers or less.

Various embodiments will be described hereinafter with reference to the accompanying drawings.

The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

First Embodiment

FIG. 1 is a cross-sectional view showing an organic electroluminescent device according to a first embodiment. As shown in FIG. 1, an organic electroluminescent device 100 includes a support substrate 60, a first electrode 10 opposed to the support substrate 60, a second electrode 20 provided between the support substrate 60 and the first electrode 10 and including poly(3,4-ethylenedioxythiophene)poly(styrenesulfonate) (PEDOT.PSS), and an intermediate layer 30 provided between the first electrode 10 and the second electrode 20. The thickness dimension D of the intermediate layer 30 is 140 nanometers (nm) or less. That is, the distance D between a surface 10a of the first electrode 10 opposed to the support substrate 60 and a surface 20a of the second electrode 20 opposed to the first electrode 10 is 140 nanometers or less. The thickness dimension D of the intermediate layer 30 is, for example, the length along the stacking direction of the first electrode 10, the second electrode 20, and the intermediate layer 30.

When a current flows through the intermediate layer 30, light including a component of visible light wavelength is emitted from the intermediate layer 30.

The surface 10a of the first electrode 10 is opposed to the intermediate layer 30. The first electrode 10 functions as, for example, a cathode. The first electrode 10 includes a conductive material. The first electrode 10 is reflective to the light emitted from the intermediate layer 30, for example. The first electrode 10 includes, for example, a metal material. The first electrode 10 includes, for example, Al, Ag, an alloy including at least one of these, or the like. The thickness dimension (the length along the stacking direction) of the first electrode 10 may be, for example, not less than 1 nanometer (nm) and not more than 1000 nanometers (nm).

The second electrode 20 is provided between the support substrate 60 and the intermediate layer 30. The second electrode 20 functions as, for example, an anode. The second electrode 20 includes a conductive polymer material. The second electrode 20 is transmissive to the light emitted from the intermediate layer 30. The second electrode 20 includes, for example, polythiophene or the like such as PEDOT.PSS. The refractive index of the second electrode 20 may be not less than 0.9 times and not more than 1.1 times the refractive index of the support substrate 60.

In the case where PEDOT.PSS is used, the ratio between PEDOT and PSS is not particularly limited. However, the higher the ratio of PEDOT is, the higher the electrical conductivity is. For example, when PEDOT (poly(3,4-ethylenedioxythiophene)) is denoted by P1 and PSS (polystyrenesulfonate) is denoted by P2, materials having a weight ratio P1:P2 between PEDOT and PSS of 1:20 have a volume resistance value of 100,000 Ω·cm, while materials having a weight ratio P1:P2 between PEDOT and PSS of 1:6 have a volume resistance value of 1000 Ω·cm. Materials having a weight ratio P1:P2 between PEDOT and PSS of 1:2.5 have a volume resistance value of, for example, 0.1 Ω·cm. Therefore, in the case where PEDOT.PSS is used as the second electrode 20, the weight ratio P1:P2 between PEDOT and PSS is preferably 1:1 to 1:10, more preferably 1:1 to 1:6, and still more preferably 1:1 to 1:2.5.

In the case where PEDOT.PSS is used, it is sufficient that this be a main material, and other materials such as an additive may be included.

The thickness dimension (the length along the stacking direction) of the second electrode 20 may be, for example, not less than 10 nanometers (nm) and not more than 500 nanometers (nm).

A surface 60a of the support substrate 60 is opposed to the second electrode 20. The support substrate 60 is transmissive to the light emitted from the intermediate layer 30. The support substrate 60 is, for example, a glass substrate or a plastic substrate. The thickness dimension (the length along the stacking direction) of the support substrate 60 may be, for example, not less than 100 micrometers (μm) and not more than 10 millimeters (mm).

The intermediate layer 30 includes a light emitting layer whereby light including a component of visible light wavelength is emitted from the intermediate layer 30.

As the light emitting material of the light emitting layer, for example, a material such as Alq3 (tris(8-hydroxyquinolinato) aluminum), F8BT (poly(9,9-dioctylfluorene-co-benzothiadiazole)), and PPV (poly(paraphenylene vinylene)) may be used.

Alternatively, for example, a mixed material of a host material and a dopant added to the host material may be used for the light emitting layer. As the host material, for example, CBP (4,4'-N,N'-bis(dicarbazolyl)-biphenyl), BCP (2,9-dimethyl-4,7-diphenyl-1,10-phenanthroline), TPD (4,4'-bis[(N-3-methylphenyl-N-phenyl)amino]biphenyl), PVK (polyvinylcarbazole)), PPT (poly(3-phenylthiophene)), and the like may be used. As the dopant material, for example, Flrpic (iridium(III)bis[(4,6-difluorophenyl)pyridinato-N,C2']picolinate), Ir(ppy)$_3$(tris(2-phenylpyridine)iridium), FIr6(bis[(2,4-difluorophenyl)pyridinato]-tetrakis(1-pyrazolyl)borate-iridium (III)), and the like may be used.

The intermediate layer 30 may include one light emitting layer, or may include a plurality of light emitting layers stacked.

The organic electroluminescent device 100 is a bottom emission type organic electroluminescent device. The light emitted from the intermediate layer 30 is extracted mainly from the second electrode 20 side (the support substrate 60 side).

By the organic electroluminescent device 100 described above, the light extraction efficiency of the organic electroluminescent device 100 can be enhanced.

FIG. 1 illustrates the optical path generated in the light emitting source LS in the intermediate layer 30. In the organic electroluminescent device 100, the optical path generated in the light emitting source LS in the intermediate layer 30 is roughly categorized into four courses. Namely, the light generated in the light emitting source LS includes an external mode component L1, a substrate mode component L2, a thin film mode component L3, and a loss component L4 at the first electrode 10 including a metal material. In the following, "the loss component L4 at the first electrode 10 including a metal material" is simply referred to as the "loss component L4".

The external mode component L1 is a component that can be extracted to the outside of the organic electroluminescent device 100. The substrate mode component L2 is a component that arrives at the support substrate 60 but is totally reflected at the interface between the support substrate 60 and the outside air. The thin film mode component L3 is a component that arrives at the second electrode 20 but is totally reflected at the interface between the second electrode 20 and the support substrate 60. The substrate mode component L2 can be extracted to the outside from a surface other than the surface 60a of the support substrate 60, for example from a surface crossing the surface 60a. Similarly, also the thin film mode component L3 can be extracted to the outside from the second electrode 20. That is, the external mode component L1, the substrate mode component L2, and the thin film mode component L3 are components extractable to the outside. In contrast, the loss component L4 is a component that is lost due to the first electrode 10.

As described later, the organic electroluminescent device 100 can reduce the amount of thin film mode components L3 and loss components L4 of the light emitted from the intermediate layer 30 and increase the amount of external mode components L1 and substrate mode components L2, and can thereby enhance the light extraction efficiency.

Figure 2:
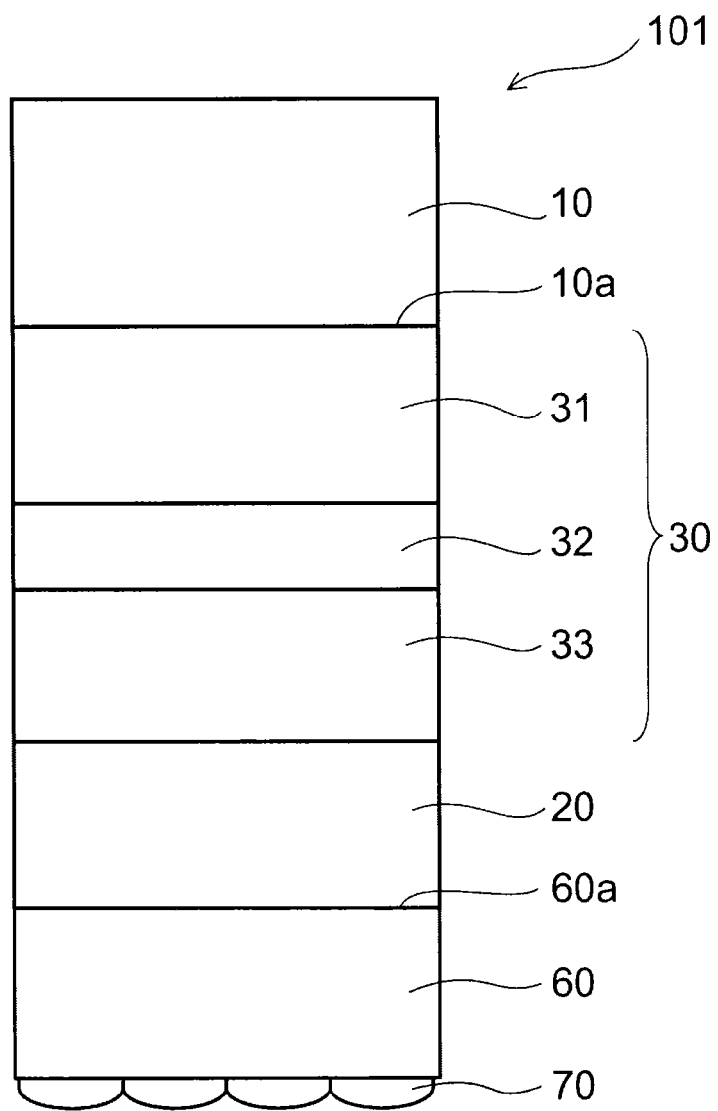
FIG. 2 is a cross-sectional view showing an organic electroluminescent device according to a first modification example of the first embodiment.

FIG. 2 is a cross-sectional view showing an organic electroluminescent device according to a first modification example of the first embodiment.

As shown in FIG. 2, an organic electroluminescent device 101 includes, as the intermediate layer 30, a light emitting layer 32 and further a first functional layer 31 provided between the light emitting layer 32 and the first electrode 10. The intermediate layer 30 includes also a second functional layer 33 provided between the light emitting layer 32 and the second electrode 20.

The first functional layer 31 functions as, for example, an electron injection layer. The first functional layer 31 functioning as an electron injection layer may include, for example, LiF, CsF, or the like. Alternatively, the first functional layer 31 functions as, for example, an electron transport layer. The first functional layer 31 functioning as an electron transport layer may include, for example, Alq3, BAlq, POPy$_2$, Bphen, 3TPYMB, or the like. In the case where the first functional layer 31 is configured as an electron injection layer, the thickness dimension of the first functional layer 31 may be set not less than 0.1 nanometers and not more than 10 nanometers. In the case where the first functional layer 31 is configured as an electron transport layer, the thickness dimension of the first functional layer 31 may be set to, for example, not less than 1 nanometer (nm) and not more than 500 nanometers (nm).

The second functional layer 33 functions as, for example, a hole injection layer. In the case where the second functional layer 33 functions as a hole injection layer, the second functional layer 33 may include, for example, α-NPD, CuPc, MoO3, or the like. Alternatively, the second functional layer 33 functions as, for example, a hole transport layer. In the case where the second functional layer functions as a hole transport layer, the second functional layer may include, for example, α-NPD, TAPC, m-MTDATA, TPD, TCTA, or the like. The thickness dimension (the length along the stacking direction) of the second functional layer 33 may be set to, for example, not less than 1 nanometer (nm) and not more than 100 nanometers (nm).

While the thickness dimensions of the first functional layer 31 and the second functional layer 33 are set to values in ranges like the above, the thickness dimension D of the intermediate layer 30 is set to 140 nanometers (nm) or less.

A plurality of microlenses 70 may be provided on a surface of the support substrate 60 on the opposite side to the side where the second electrode 20 is provided. The support substrate 60 may be provided between the microlens 70 and the second electrode 20. The shape of the microlens 70 is not particularly limited, and may be, for example, a hemispherical shape or the like. In the case where a plurality of microlenses 70 are provided on the support substrate 60, a microlens sheet in which the plurality of microlenses 70 are arranged in a matrix configuration may be prepared beforehand, and the microlens sheet may be attached to the support substrate 60. The microlens 70 includes a light transmissive material that transmits the light emitted from the intermediate layer 30. A resin, for example, may be used for the microlens 70. The microlens 70 may be omitted.

The first functional layer 31 and the second functional layer 33 may be omitted. It is also possible to provide only one of the first functional layer 31 and the second functional layer 32.

Figure 3:
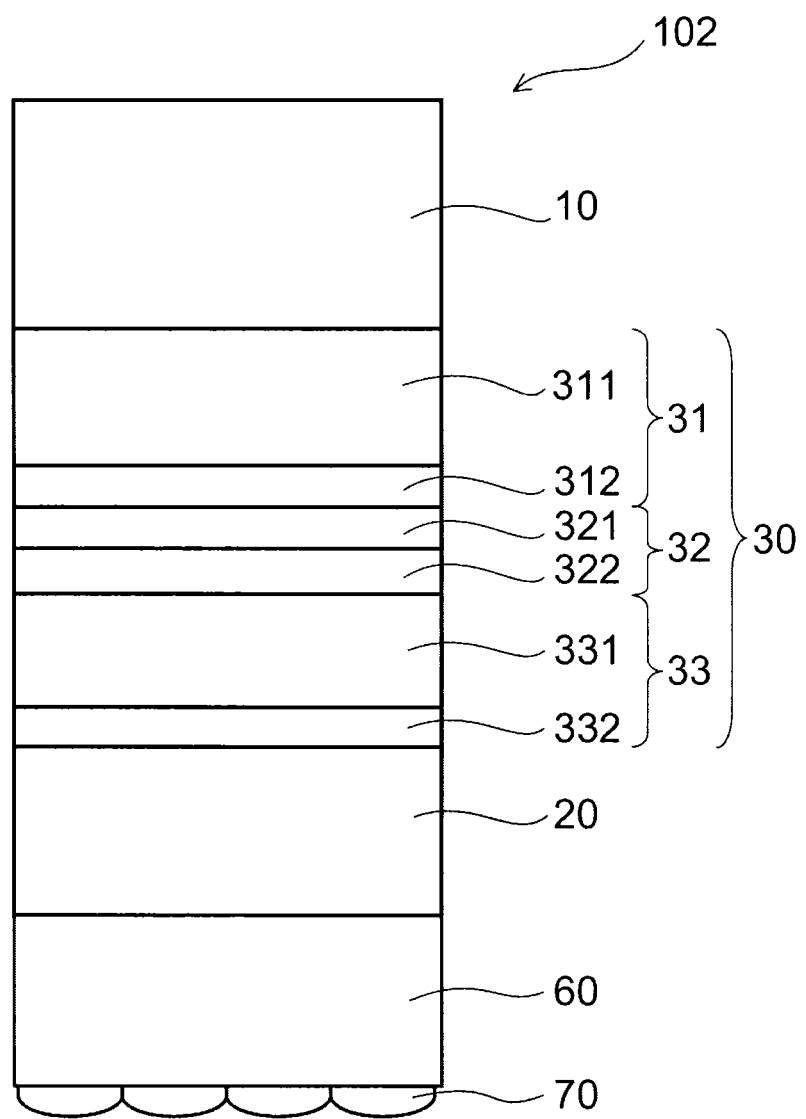
FIG. 3 is a cross-sectional view showing an organic electroluminescent device according to a second modification example of the first embodiment.

FIG. 3 is a cross-sectional view showing an organic electroluminescent device according to a second modification example of the first embodiment.

As shown in FIG. 3, an organic electroluminescent device 102 includes an electron injection layer 311 and an electron transport layer 312 as the first functional layer 31. The electron injection layer 311 is provided on the first electrode 10 side of the first functional layer 31, and the electron transport layer 312 is provided on the light emitting layer 32 side of the first functional layer 31. That is, the electron transport layer 312 is provided between the electron injection layer 311 and the light emitting layer 32.

The organic electroluminescent device 102 includes a hole transport layer 331 and a hole injection layer 332 as the second functional layer 33. The hole transport layer 331 is provided on the light emitting layer 32 side of the second functional layer 33, and the hole injection layer 332 is provided on the second electrode 20 side of the second functional layer 33. That is, the hole transport layer 331 is provided between the hole injection layer 332 and the light emitting layer 32.

The organic electroluminescent device 102 includes a first light emitting layer 321 and a second light emitting layer 322 as the light emitting layer 32. The wavelength of emitted light is different between the first light emitting layer 321 and the second light emitting layer 322. That is, the wavelength of the light emitted by the second light emitting layer 322 is different from the wavelength of the light emitted by the first light emitting layer 321. For example, the first light emitting layer 321 emits light having a component of blue wavelength, and the second light emitting layer 322 emits light having a component of red and green wavelength. The second light emitting layer 322 is provided between the first light emitting layer 321 and the second electrode 20, for example. In this example, the second light emitting layer 322 is provided between the first light emitting layer 321 and the second functional layer 33. The second light emitting layer 322 may be provided between the first light emitting layer 321 and the first electrode 10. The second light emitting layer 322 may be provided between the first light emitting layer 321 and the first functional layer 31.

The first functional layer 31 may be a stacked body of an electron injection layer and an electron transport layer, and the second functional layer 33 may be either a hole transport layer or a hole injection layer. The first functional layer 31 may be either an electron injection layer or an electron transport layer, and the second functional layer 33 may be a stacked body of a hole transport layer and a hole injection layer.

This time, the inventors have found a relationship between the thickness dimension of the intermediate layer 30 and the light extraction efficiency, and it will now be described using FIG. 4 and FIG. 5.

Figure 4:
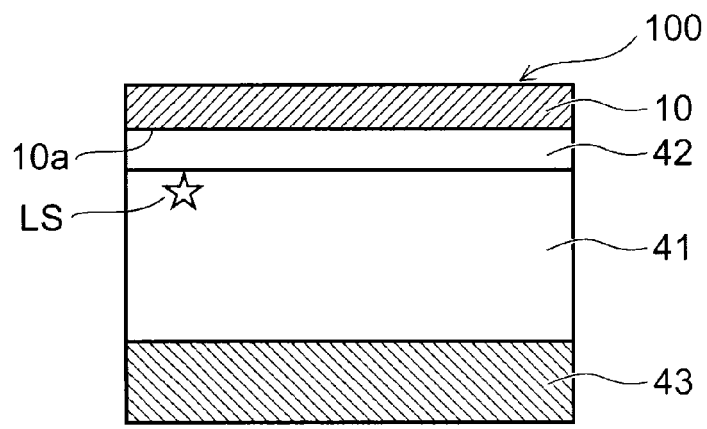
FIG. 4 is a cross-sectional view showing an organic electroluminescent device used for simulation.

FIG. 4 is a cross-sectional view showing an organic electroluminescent device 110 used for simulation. The organic electroluminescent device 110 includes a first layer 41 with a refractive index of 1.8 and a second layer 42 with a refractive index of 1.7 between a third layer 43 with a refractive index of 1.5 and the first electrode 10. The first layer 41 is a layer including a light emitting layer. The second layer 42 is a layer provided as an electron transport layer. The third layer 43 is a layer including a substrate.

A simulation was performed for the external mode component L1 and the support mode component L2 at a wavelength of 550 nm when the thickness dimension of the second layer 42 was set to 45 nanometers or 70 nanometers and the thickness dimension of the first layer 41 was changed. The thickness dimension of the first layer 41 was changed from 0 nanometers to 300 nanometers. The first electrode 10 was aluminum with a refractive index of 0.8, a complex refractive index of 5.7, and a thickness dimension of 150 nanometers (nm). The refractive indices mentioned above are the value to the wavelength of 550 nm. It is assumed that the first layer 41 includes the light emitting layer on the side in contact with the second layer 42, the light emitting source LS is hypothetically located near the boundary of the first layer 41 with the second layer 42, and light is emitted from the position of the light emitting source LS.

Figure 5:
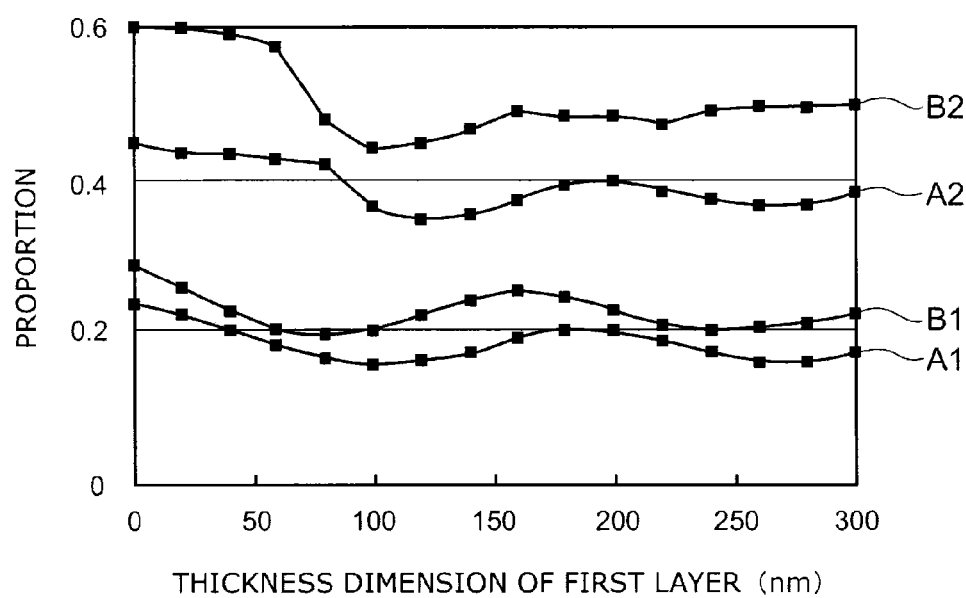
FIG. 5 is a graph showing the simulation results.

FIG. 5 is a graph showing the simulation results. The horizontal axis of FIG. 5 represents the thickness dimension of the first layer 41, where the unit is the nanometer. The vertical axis of FIG. 5 represents the proportion of external mode components L1 and the proportion of the sum of external mode components L1 and substrate mode components L2 in the light emitted from the light emitting source LS. The proportion of external mode components L1 when the thickness dimension of the second layer 42 is 45 nanometers is shown by A1, and the proportion of the sum of external mode components L1 and substrate mode components L2 is shown by A2. The proportion of external mode components L1 when the thickness dimension of the second layer 42 is 70 nanometers is shown by B1, and the proportion of the sum of external mode components L1 and substrate mode components L2 is shown by B2.

When the thickness dimension of the second layer 42 is 45 nanometers and the thickness dimension of the first layer 41 is 80 nanometers or less, both the proportion A1 of external mode components L1 and the proportion A2 of the sum of external mode components L1 and substrate mode components L2 are high. When the thickness dimension of the second layer 42 is 70 nanometers and the thickness dimension of the first layer 41 is 60 nanometers or less, both the proportion B1 of external mode components L1 and the proportion B2 of the sum of external mode components L1 and substrate mode components L2 are high.

That is, when the sum of the thickness dimensions of the first layer 41 and the second layer 42 is 140 nanometers or less, the proportion of external mode components L1 and substrate mode components L2 in the light emitted from the light emitting source LS is large. In other words, when the refractive index of the second electrode 20 is substantially equal to the refractive index of the intermediate layer 30, the sum of the thickness dimensions of the second electrode 20 and the intermediate layer 30 is set to 140 nanometers or less. Alternatively, when the refractive index of the second electrode 20 is not substantially equal to the refractive index of the intermediate layer 30, the thickness dimension of the intermediate layer 30 is set to 140 nanometers or less. In the embodiment, the refractive index of the second electrode 20 is not set substantially equal to the refractive index of the intermediate layer 30, and the thickness dimension of the intermediate layer 30 is set to 140 nanometers or less. The case where the refractive index of the second electrode 20 is not substantially equal to the refractive index of the intermediate layer 30 is, for example, the case where the refractive index of the second electrode 20 is smaller than 0.9 times the refractive index of the intermediate layer 30 or the case where the refractive index of the second electrode 20 is larger than 1.1 times the refractive index of the intermediate layer 30.

As described above, the external mode component L1 and the substrate mode component L2 are components extractable to the outside of the organic electroluminescent device; thus, the organic electroluminescent device with a high proportion of external mode components L1 and substrate mode components L2 has a high light extraction efficiency.

In particular, since the refractive index of the second electrode 20 is not less than 0.9 times and not more than 1.1 times the refractive index of the support substrate 60, the light that has arrived at the second electrode 20 can be extracted efficiently to the outside of the organic electroluminescent device.

In general, the bottom emission type organic electroluminescent device includes a transparent electrode of indium tin oxide (ITO) or the like on the support substrate 60. Since the refractive index of ITO is approximately 1.8 and the refractive index of a common intermediate layer 30 is approximately 1.8, in the case where ITO is used as the transparent electrode, it is necessary that the sum of the thickness dimensions of the intermediate layer 30 and the second electrode 20 be made 140 nanometers or less. However, the ITO needs to be formed with such a thickness that electrical conductivity as an electrode can be ensured, and the sum of the thickness dimensions of the ITO and the intermediate layer 30 is actually approximately 200 nanometers, for example. On the other hand, in the embodiment, by setting the thickness dimension of the intermediate layer 30 to 140 nanometers or less, the proportion of external mode components L1 and substrate mode components L2 can be increased.

In general, to enhance the efficiency of holes being injected into the light emitting layer, there is a case where a hole injection layer is provided between the anode and the light emitting layer. However, in the case where PEDOT.PSS is used as the second electrode 20, since PEDOT.PSS has the property of being capable of injecting holes into the light emitting layer 32 efficiently, it is not necessary to provide a hole injection layer between the second electrode 20 and the light emitting layer 32. In the case where a hole injection layer is not provided, the thickness dimension of the intermediate layer 30 can be made still thinner.

The difference in refractive index between the support substrate 60 and the second electrode 20 is preferably small. When the difference in refractive index between the support substrate 60 and the second electrode 20 is small, the amount of light reflected at the boundary between the support substrate 60 and the second electrode 20 is small, and the light from the light emitting source LS can be efficiently emitted to the outside. For example, since PEDOT.PSS has a refractive index of approximately 1.5, a material with a refractive index of approximately 1.5, such as a glass substrate, is preferably used as the support substrate 60.

In the case where PEDOT.PSS is used as the second electrode 20, the second electrode 20 can be formed by the wet processes (solution process). In the case where the second electrode 20 is formed by the wet processes, the formation is easy and the organic electroluminescent device can be manufactured at low cost.

Second Embodiment

Figure 6:
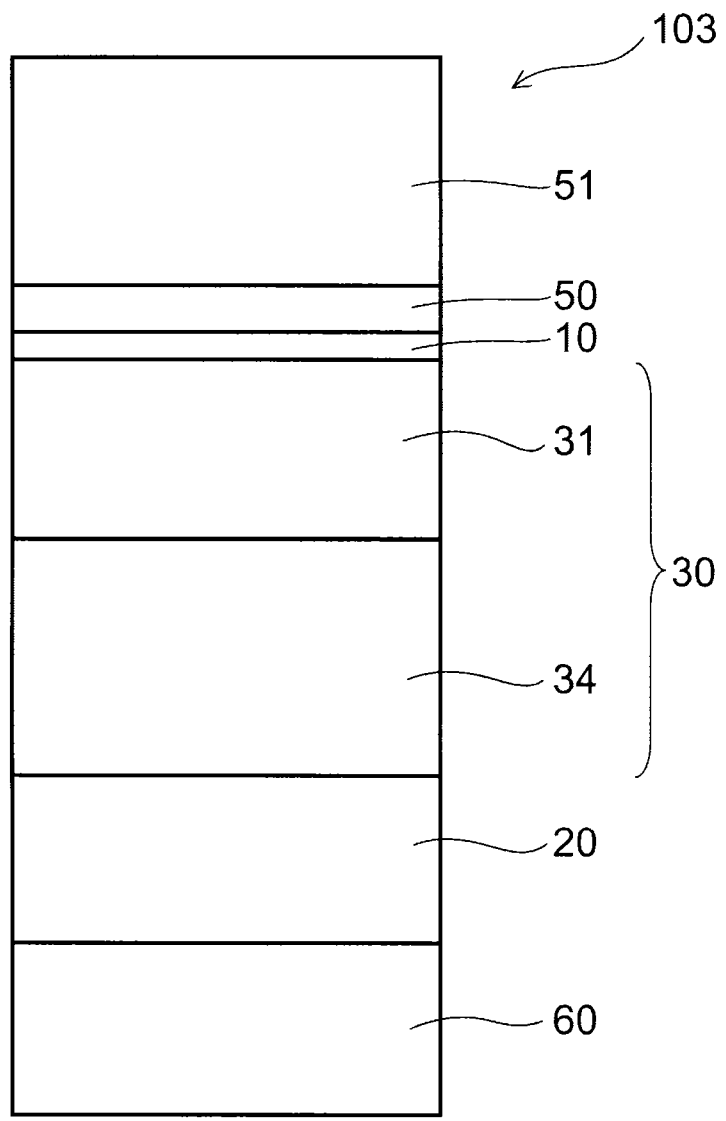
FIG. 6 is a cross-sectional view showing an organic electroluminescent device according to a second embodiment.

FIG. 6 is a cross-sectional view showing an organic electroluminescent device according to a second embodiment. As shown in FIG. 6, an organic electroluminescent device 103 includes the support substrate 60, the first electrode 10 opposed to the support substrate 60, the second electrode 20 provided between the support substrate 60 and the first electrode 10 and formed of a conductive polymer material, and the intermediate layer 30 provided between the first electrode 10 and the second electrode 20. The intermediate layer 30 includes the first functional layer 31 and a layer 34 including a light emitting layer and a second functional layer. The thickness dimension of the intermediate layer 30 is 140 nanometers or less.

In the embodiment, the first electrode 10 is light transmissive.

A reflection layer 51 is provided on a surface of the first electrode 10 on the opposite side to a surface opposed to the intermediate layer 30. That is, in this example, the first electrode 10 is provided between the intermediate layer 30 and the reflection layer 51. An optical buffer layer 50 is provided between the reflection layer 51 and the first electrode 10.

The material of the optical buffer layer 50 is transmissive to the light emitted from the light emitting layer 32. The optical buffer layer 50 may include silicon oxide ($SiO_2$), lithium fluoride (LiF), calcium fluoride ($CaF_2$), magnesium fluoride ($MgF_2$), or the like or gas such as air, nitrogen gas, and a rare gas. In the case where the optical buffer layer 50 is configured to include gas, a sealing layer may be formed around the optical buffer layer 50 so as to keep the spacing between the first functional layer 31 and the first electrode 10 constant. The thickness dimension of the optical buffer layer 50 may be, for example, not less than 10 nanometers and not more than 100 micrometers.

The reflection layer 51 is reflective to the light emitted from the light emitting layer 32. The thickness dimension of the reflection layer 51 may be, for example, not less than 10 nanometers and not more than 1 micrometer. The reflection layer 51 may include, for example, a metal such as Ag, Mg:Ag (magnesium-silver alloy), and Al. The reflection layer 51 may be also a dielectric multiple-layer film, for example.

In the organic electroluminescent device 103 thus configured, the amount of external mode components L1 and substrate mode components L2 is large, and the light extraction efficiency is high.

A simulation performed for the organic electroluminescent device 103 of the embodiment will now be described using FIG. 7. In the simulation, the following model was used as the organic electroluminescent device 103. That is, the second electrode 20 was PEDOT.PSS with a thickness dimension of 50 nanometers and a refractive index of 1.5. The support substrate 60 was a glass substrate with a refractive index of 1.5. The first electrode 10 was silver with a thickness dimension of 5 nanometers. The first functional layer 31 had a thickness dimension of 45 nanometers or 70 nanometers and a refractive index of 1.7. The optical buffer layer 50 was an air layer with a thickness dimension of 1 micrometer. The reflection layer 51 was silver with a thickness dimension of 150 nanometers, a refractive index of 0.1, and a complex refractive index of 3.64. The thickness dimension of the intermediate layer 30 is 140 nanometers or less.

Figure 7:
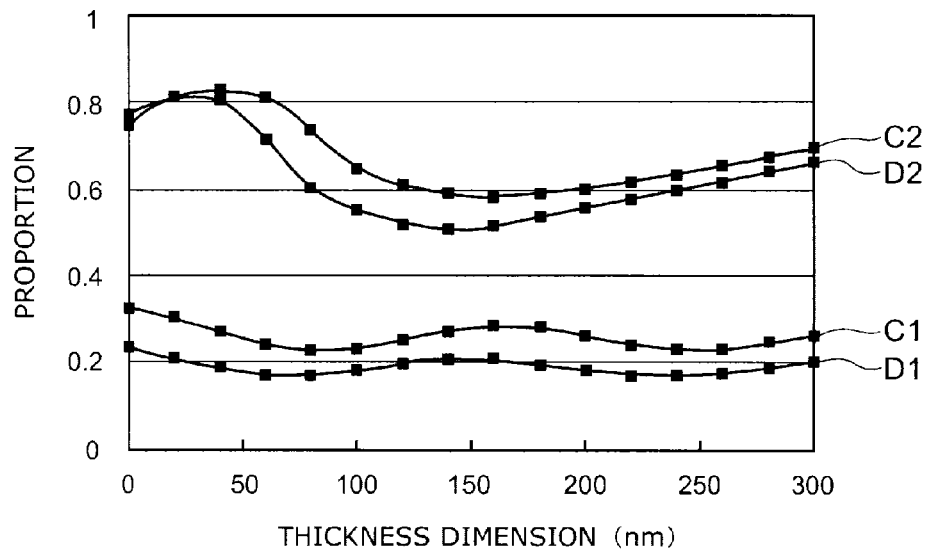
FIG. 7 is a graph showing the simulation results.

FIG. 7 is a graph showing the simulation results. The horizontal axis of FIG. 7 represents the thickness dimension of the layer 34, where the unit is the nanometer. The vertical axis of FIG. 7 represents the proportion of the sum of external mode components L1 and substrate mode components L2 in the light emitted from the light emitting source. The proportion of external mode components L1 when the thickness dimension of the first functional layer 31 is 45 nanometers is shown by C1, and the proportion of the sum of external mode components L1 and substrate mode components L2 is shown by C2. The proportion of external mode components L1 when the thickness dimension of the first functional layer 31 is 70 nanometers is shown by D1, and the proportion of the sum of external mode components L1 and substrate mode components L2 is shown by D2.

When the thickness dimension of the first functional layer 31 is 45 nanometers and the thickness dimension of the layer 34 is 80 nanometers or less, both the proportion C1 of external mode components L1 and the proportion C2 of the sum of external mode components L1 and substrate mode components L2 are high. When the thickness dimension of the first functional layer 31 is 70 nanometers and the thickness dimension of the layer 34 is 60 nanometers or less, both the proportion D1 of external mode components L1 and the proportion D2 of the sum of external mode components L1 and substrate mode components L2 are high.

As shown in FIG. 7, the embodiment can increase the amount of external mode components L1 and substrate mode components L2.

Third Embodiment

Figure 8:
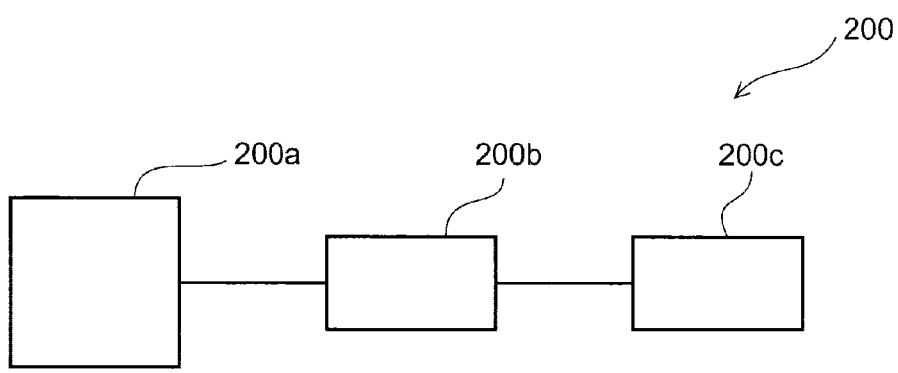
FIG. 8 is a schematic diagram showing a light emitting apparatus.

A light emitting apparatus using one of the organic electroluminescent devices 100, 101, 102, and 103 described in the first embodiment and the second embodiment will now be described. FIG. 8 is a schematic diagram showing a light emitting apparatus 200.

As shown in FIG. 8, the light emitting apparatus 200 includes a light emitting unit 200a, a drive unit 200b, and a control unit 200c.

The light emitting unit 200a includes one of the organic electroluminescent devices 100, 101, 102, and 103 described above one or more in number. There are no particular limitations on the arrangement configuration in the case where a plurality of organic electroluminescent devices are arranged. In the case where a plurality of organic electroluminescent devices are arranged, for example, a regular arrangement or an arbitrary irregular arrangement is possible. The number of organic electroluminescent devices is not limited to that illustrated, but may be appropriately altered.

The drive unit 200b supplies a current to the light emitting unit 200a. The drive unit 200b may include a drive circuit. In the case where the light emitting unit 200a includes a plurality of organic electroluminescent devices, all the organic electroluminescent devices may be driven by one drive unit 200b, or one organic electroluminescent device may be driven by one drive unit. That is, one drive unit 200b may supply a current to each of the plurality of organic electroluminescent devices. Alternatively, a plurality of drive units 200b individually corresponding to a plurality of organic electroluminescent devices are provided. Each of the plurality of drive units 200b may supply a current to each of the plurality of organic electroluminescent devices. In this case, the number of drive units 200b is the same as the number of organic electroluminescent devices, for example. The number of drive units 200b may be different from the number of organic electroluminescent devices. For example, the number of drive units 200b may be smaller than the number of organic electroluminescent devices.

For example, in the case where the light emitting apparatus 200 is a display device, the drive unit 200b may be configured to supply a current on the basis of each organic electroluminescent device.

Furthermore, for example, in the case where the light emitting apparatus 200 is a lighting device, the drive unit 200b may be configured to supply a current to all the organic electroluminescent devices.

The scheme of driving by the drive unit 200b is not limited to those illustrated, but may be appropriately altered based on the use etc. of the light emitting apparatus 200.

The control unit 200c controls the driving of the drive unit 200b. The control unit 200c may include, for example, a control circuit that controls the drive unit 200b. In the case where a plurality of drive units 200b are provided, the control unit 200c controls the driving of each of the plurality of drive units 200b.

Known art can be applied to components other than the organic electroluminescent device described above. A detailed description of the light emitting unit 200a, the drive unit 200b, and the control unit 200c is therefore omitted.

The light emitting apparatus 200 using one of the organic electroluminescent devices 100, 101, 102, and 103 has high luminance.

As described above, the embodiments of the invention are described with reference to specific examples. However, the embodiments of the invention are not limited to these specific examples. The specific configurations of the components are incorporated in the scope of the invention as long as a person skilled in the art appropriately selects components from the publicly known range to similarly implement the invention for obtaining the similar effect.

Moreover, all organic electroluminescent devices and light emitting apparatuses practicable by an appropriate design modification by one skilled in the art based on the organic electroluminescent devices and light emitting apparatuses described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An organic electroluminescent device comprising:
a support substrate;
a first electrode opposed to the support substrate;
a second electrode provided between the support substrate and the first electrode and including a conductive polymer material; and
an intermediate layer provided between the first electrode and the second electrode,
a thickness dimension of the intermediate layer being 140 nanometers or less, and a refractive index of the second electrode being not less than 0.8 times and not more than 1.05 times a refractive index of the support substrate.

2. The device according to claim 1, wherein a refractive index of the second electrode is not less than 0.9 times and not more than 1.1 times a refractive index of the support substrate.

3. The device according to claim 1, wherein the second electrode includes poly(3,4-ethylenedioxythiophene)poly(styrenesulfonate).

4. The device according to claim 3, wherein a weight ratio P1:P2 between the poly(3,4-ethylenedioxythiophene) and the polystyrenesulfonate is 1:1 to 1:10, where P1 is the poly(3,4-ethylenedioxythiophene) and P2 is the polystyrenesulfonate.

5. The device according to claim 1, wherein
the first electrode is light reflective,
the second electrode is light transmissive, and
the support substrate is light transmissive.

6. The device according to claim 1, wherein the intermediate layer includes:
a light emitting layer;
a first functional layer provided between the light emitting layer and the first electrode; and
a second functional layer provided between the light emitting layer and the second electrode.

7. The device according to claim 6, wherein the first functional layer is an electron injection layer.

8. The device according to claim 6, wherein the first functional layer is an electron transport layer.

9. The device according to claim 6, wherein the second functional layer is a hole injection layer.

10. The device according to claim 6, wherein the second functional layer is a hole transport layer.

11. The device according to claim 6, wherein the first functional layer includes:
an electron injection layer; and
an electron transport layer provided between the electron injection layer and the light emitting layer.

12. The device according to claim 6, wherein the second functional layer includes:
a hole injection layer; and
a hole transport layer provided between the hole injection layer and the light emitting layer.

13. The device according to claim 6, wherein
the light emitting layer includes:
a first light emitting layer; and
a second light emitting layer emitting light including a wavelength different from a wavelength of light emitted by the first light emitting layer.

14. The device according to claim 1, wherein the intermediate layer includes:
a light emitting layer; and
a first functional layer provided between the light emitting layer and the first electrode.

15. The device according to claim 1, wherein the intermediate layer includes:
a light emitting layer; and
a second functional layer provided between the light emitting layer and the second electrode.

16. A light emitting apparatus comprising:
a light emitting unit including an organic electroluminescent device;
a drive unit configured to supply a current to the organic electroluminescent device; and
a control unit configured to control the drive unit,
the organic electroluminescent device including:
a support substrate;
a first electrode opposed to the support substrate;
a second electrode provided between the support substrate and the first electrode and including a conductive polymer material; and
an intermediate layer provided between the first electrode and the second electrode,
a thickness dimension of the intermediate layer being 140 nanometers or less, and
a refractive index of the second electrode being not less than 0.8 times and not more than 1.05 times a refractive index of the support substrate.

17. The apparatus according to claim 16, wherein the light emitting unit includes plurality of the organic electroluminescent devices.

18. The apparatus according to claim 17, wherein the drive unit supplies a current to each of the organic electroluminescent devices.

19. The apparatus according to claim 17, wherein
the apparatus includes plurality of the drive units, and
each of the drive units supplies a current to each of the organic electroluminescent devices.

* * * * *